US009543023B2

(12) United States Patent
Lai et al.

(10) Patent No.: US 9,543,023 B2
(45) Date of Patent: Jan. 10, 2017

(54) PARTIAL BLOCK ERASE FOR BLOCK PROGRAMMING IN NON-VOLATILE MEMORY

(71) Applicant: SanDisk Technologies Inc., Plano, TX (US)

(72) Inventors: Chun-hung Lai, Kamakura (JP); Cheng-Kuan Yin, Tokyo (JP); Shih-Chung Lee, Yokohama (JP); Deepanshu Dutta, Fremont, CA (US); Ken Oowada, Fujisawa (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/794,236

(22) Filed: Jul. 8, 2015

(65) Prior Publication Data

US 2016/0217860 A1 Jul. 28, 2016

Related U.S. Application Data

(60) Provisional application No. 62/107,053, filed on Jan. 23, 2015.

(51) Int. Cl.
*G11C 16/08* (2006.01)
*G11C 16/16* (2006.01)
(Continued)

(52) U.S. Cl.
CPC ........... *G11C 16/14* (2013.01); *G11C 11/5628* (2013.01); *G11C 16/0483* (2013.01); *G11C 16/10* (2013.01);
(Continued)

(58) Field of Classification Search
USPC ............. 365/185.11, 185.22, 185.29, 185.24
See application file for complete search history.

(56) References Cited

U.S. PATENT DOCUMENTS 6,707,714 B2   3/2004  Kawamura
7,403,424 B2   7/2008  Hemink et al.
(Continued)

OTHER PUBLICATIONS

U.S. Appl. No. 14/794,242, filed Jul. 8, 2015.
(Continued)

*Primary Examiner* — Hoai V Ho
*Assistant Examiner* — Minh Dinh
(74) *Attorney, Agent, or Firm* — Vierra Magen Marcus LLP

(57) ABSTRACT

A non-volatile memory system utilizes partial block erasing during program operations to mitigate the effects of programming pass voltage disturbances. A programming request is received that is associated with a group of word lines from a block, such as all or a portion of the word lines. The system erases and soft programs the block prior to beginning programming. The system programs a subset of the word lines of the block for the programming request. After programming the subset of word lines, the system pauses the programming operation and performs an erase operation for the unprogrammed word lines of the block. The already programmed word lines and one or more optional buffer word lines may be inhibited from erasing during the erase operation. After erasing the unprogrammed word lines, the system completes the programming request by programming the remaining user data in the unprogrammed region of the block.

23 Claims, 17 Drawing Sheets

(51) Int. Cl.
  *G11C 16/14* (2006.01)
  *G11C 11/56* (2006.01)
  *G11C 16/04* (2006.01)
  *G11C 16/10* (2006.01)
  *G11C 16/34* (2006.01)

(52) U.S. Cl.
  CPC ......... *G11C 16/349* (2013.01); *G11C 16/3431* (2013.01); *G11C 2211/5648* (2013.01); *G11C 2216/24* (2013.01)

(56) References Cited

U.S. PATENT DOCUMENTS

| | | |
|---|---|---|
| 7,430,138 B2 | 9/2008 | Higashitani |
| 7,457,166 B2 | 11/2008 | Hemink et al. |
| 7,495,954 B2 | 2/2009 | Ito |
| 7,804,718 B2 | 9/2010 | Kim |
| 7,808,831 B2 | 10/2010 | Mokhlesi et al. |
| 7,818,525 B1 | 10/2010 | Frost et al. |
| 7,839,690 B2 | 11/2010 | Lee et al. |
| 7,907,449 B2 | 3/2011 | Lee et al. |
| 7,965,554 B2 | 6/2011 | Lutze et al. |
| 8,014,209 B2 | 9/2011 | Lutze et al. |
| 8,144,511 B2 | 3/2012 | Dong et al. |
| 8,422,303 B2 | 4/2013 | Franca-Neto et al. |
| 8,488,382 B1 | 7/2013 | Li et al. |
| 8,493,781 B1 | 7/2013 | Meir et al. |
| 8,649,215 B2 | 2/2014 | Franca-Neto et al. |
| 8,670,285 B2 | 3/2014 | Dong et al. |
| 8,743,615 B2 | 6/2014 | Lee et al. |
| 8,787,094 B2 | 7/2014 | Costa et al. |
| 8,824,211 B1 | 9/2014 | Costa et al. |
| 8,885,420 B2 | 11/2014 | Oowada et al. |
| 8,897,070 B2 | 11/2014 | Dong et al. |
| 8,913,431 B1 | 12/2014 | Costa et al. |
| 2008/0089132 A1* | 4/2008 | Ito .................... G11C 16/3477 365/185.22 |
| 2010/0002515 A1* | 1/2010 | Lutze ................. G11C 11/5635 365/185.17 |
| 2011/0242899 A1* | 10/2011 | Oowada ............. G11C 11/5635 365/185.19 |
| 2012/0008405 A1 | 1/2012 | Shah et al. |
| 2012/0170365 A1 | 7/2012 | Kang et al. |
| 2012/0269020 A1 | 10/2012 | Park et al. |
| 2013/0070530 A1 | 3/2013 | Chen et al. |
| 2013/0314995 A1 | 11/2013 | Dutta et al. |
| 2014/0136765 A1* | 5/2014 | Oh .................... G11C 16/0483 711/103 |
| 2015/0003162 A1 | 1/2015 | Mui et al. |
| 2015/0071008 A1 | 3/2015 | Yang et al. |

OTHER PUBLICATIONS

U.S. Appl. No. 14/619,857, filed Feb. 11, 2015.
U.S. Appl. No. 14/518,340, filed Oct. 20, 2014.
U.S. Appl. No. 62/088,020, filed Dec. 5, 2014.
International Search Report & the Written Opinion of the International Searching Authority dated Feb. 23, 2016, International Application No. PCT/US2015/062781.

* cited by examiner

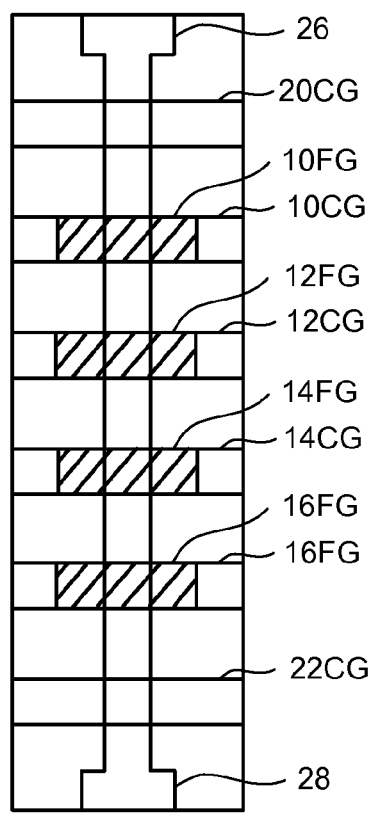
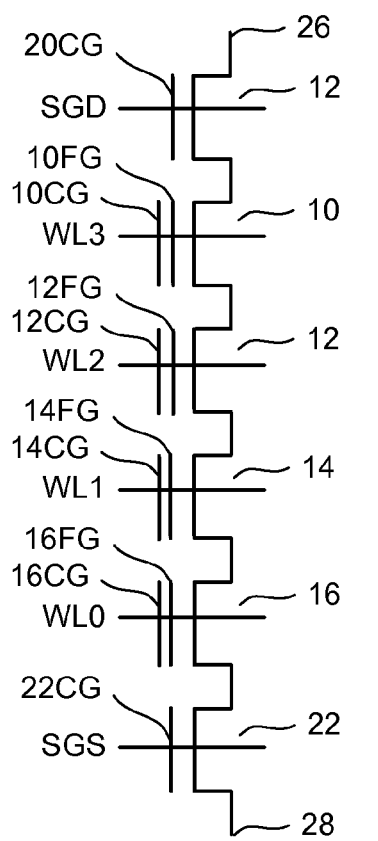

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 | ting # PARTIAL BLOCK ERASE FOR BLOCK PROGRAMMING IN NON-VOLATILE MEMORY

PRIORITY CLAIM

The present application claims priority from U.S. Provisional Patent Application No. 62/107,053, entitled "Partial Erase for Higher Word Lines," by Chun-hung Lai, et al., filed Jan. 23, 2015, incorporated by reference herein in its entirety.

BACKGROUND OF THE INVENTION

The present disclosure is directed to non-volatile memory technology.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (VTH) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM applied to the control gate during a program operation is applied as a series of pulses that increase in magnitude over time. In one possible approach, the magnitude of the pulses is increased with each successive pulse by a predetermined step size, e.g., 0.2-0.4V. VPGM can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data. Despite these considerations, there remains a need for improved read, erase, and program operations in on-volatile memory.

BRIEF DESCRIPTION OF THE DRAWINGS

FIG. 1 is a top view of an example of a NAND string.

FIG. 2 is an equivalent circuit diagram of the NAND string of FIG. 1.

FIGS. 12A-12E depict various threshold voltage distributions and describe a process for programming non-volatile memory.

DETAILED DESCRIPTION

Figure 3:
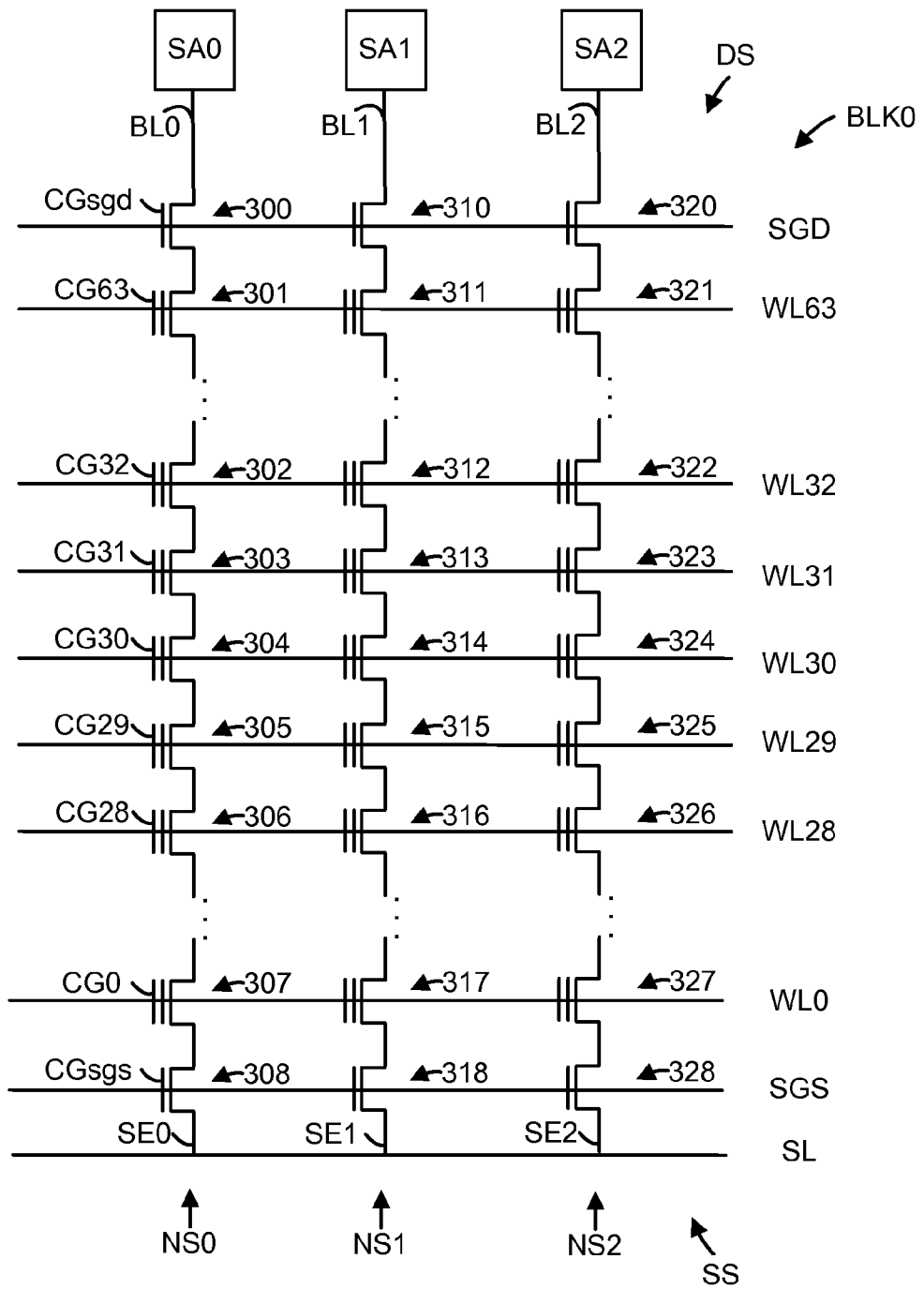
FIG. 3 is a block diagram of an example of three NAND strings in a block of non-volatile storage elements.

A non-volatile memory system mitigates potential disturbance of non-volatile storage elements that results from pass voltages applied during programming of non-volatile memory. In non-volatile memory architectures using a block-based architecture, a pass voltage is applied to one or more unselected word lines when programming a selected word line. When a pass voltage is applied to a word line that has been erased and that is not yet programmed, inadvertent programming due to the pass voltage may occur. In some cases, this may result in an erased memory cell moving close to or within a range of threshold distributions for a programmed state. Other shifts in threshold voltages of other states following additional programming as well as additional disturbances may occur. To mitigate the effects of these pass voltage disturbances, programming operations are divided into portions with a partial block erase being performed between programming portions.

A non-volatile memory system is provided that utilizes a partial block erase in an unprogrammed region of a memory block as part of a programming process. The memory system receives a programming request associated with a memory block. The programming request may include user data to be programmed in all or a portion of the word lines of the memory block. The memory system divides the programming operation for the programming request into portions with one or more intervening partial block erase operations. The system programs a subset of the word lines of the memory block with a subset of the user data for the programming request. The subset of word lines includes the first word line to be programmed for the memory block and a contiguous set of word lines thereafter of the block. After programming the subset of word lines, the system pauses the programming operation.

With the programming operation paused, the system performs a partial block erase for the unprogrammed region of the memory block. The system erases the memory cells that have not been programmed in the memory block, while inhibiting the already programmed memory cells from being programmed. In this manner, any program disturbance in the unprogrammed region resulting from applications of pass voltages while programming the first subset of word lines can be removed. The system erases the memory cells back to an erased condition. After performing the partial block erase operation, the system programs the unprogrammed region of the memory block to complete the programming operation.

The memory system may utilize any number of zones when programming a memory block. For example, the system may program a first zone, then perform a partial block erase on the unprogrammed region of the memory block including a second zone and a third zone. After erasing the second and third zones, the system programs the second zone, followed by erasing the third zone again. After erasing the third zone, the system programs the third zone. Additional zones may be used and the process repeated.

In various embodiments, the system may only perform partial block erase operations after a predetermined number of write/erase cycles for a memory block. Moreover, the system may vary the size of zones that are programmed before erasing based on the number of write/erase cycles.

The system may perform a partial block erase by erasing at least a portion of the memory cells in the unprogrammed region while inhibiting the programmed memory cells from being erased. For example, the system may apply an erase enable voltage (e.g., 0.5V or ground) to one or more word lines in the unprogrammed region while applying an erase inhibit voltage to one or more of the word lines in the programmed region. The system can float or apply a positive voltage at or near the erase voltage pulse to inhibit erasing in the programmed region. Variations of the enable and inhibit voltages may be used.

One example of a flash memory system uses the NAND structure, which includes multiple transistors arranged in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Other types of non-volatile memory in addition to NAND flash memory can also be used in accordance with embodiments.

Typical architectures for flash memory using NAND structures include many NAND strings. FIG. 3 depicts three NAND strings such as shown in FIGS. 1-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate drain (SGD) transistor, and the control gates of the SGD transistors are connected via a common SGD line. The NAND strings are connected at their other end to a select gate source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. NAND string NS1 includes storage elements 311, . . . , 312-316, . . . , 317, an SGS transistor 318 and a SGD transistor 310. NAND string NS2 includes storage elements 321, . . . , 322-326, . . . , 327, an SGS transistor 328 and a SGD transistor 320. NAND strings NS0, NS2, . . . are even numbered, and NAND strings NS1, NS3 (not shown), . . . are odd numbered. Similarly, bit lines BL0, BL2, . . . are even numbered, and the NAND strings BL1, BL3 (not shown), . . . are odd numbered. The storage elements can store user data and/or non-user data.

Figure 4:
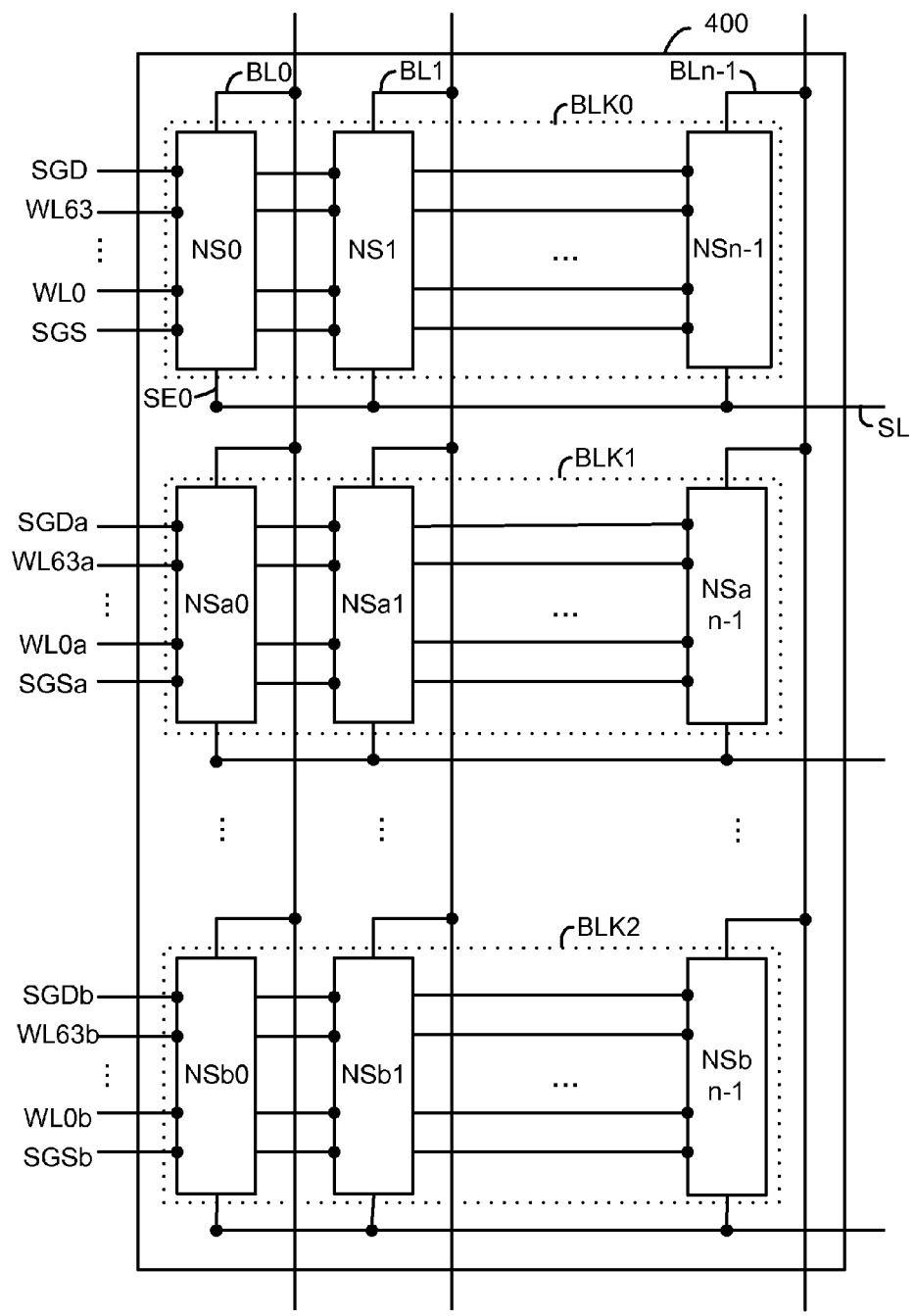
FIG. 4 is a block diagram of an array of NAND flash memory cells arranged into blocks.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn−1 in communication with BL0, BL1, . . . BLn−1, respectively, and with WL0-WL63 SGS and SGD. BLK1 includes NAND strings NSa0, NSa1, . . . , NSan−1 in communication with BL0, BL1, . . . BLn−1, respectively, and with WL0a-WL63a, SGSa and SGDa. BLK2 includes NAND strings NSb0, NSb1, . . . , NSbn−1 in communication with BL0, BL1, . . . BLn−1, respectively, and with WL0b-WL63b, SGSb and SGDb.

It is common for flash EEPROM systems to utilize a block as the unit of erase, which may be referred to as an erase block or physical block. Each block can contain the minimum number of memory cells that are erased together, although multiple blocks may be erased simultaneously. Smaller units of cells may be erased together in some implementations. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
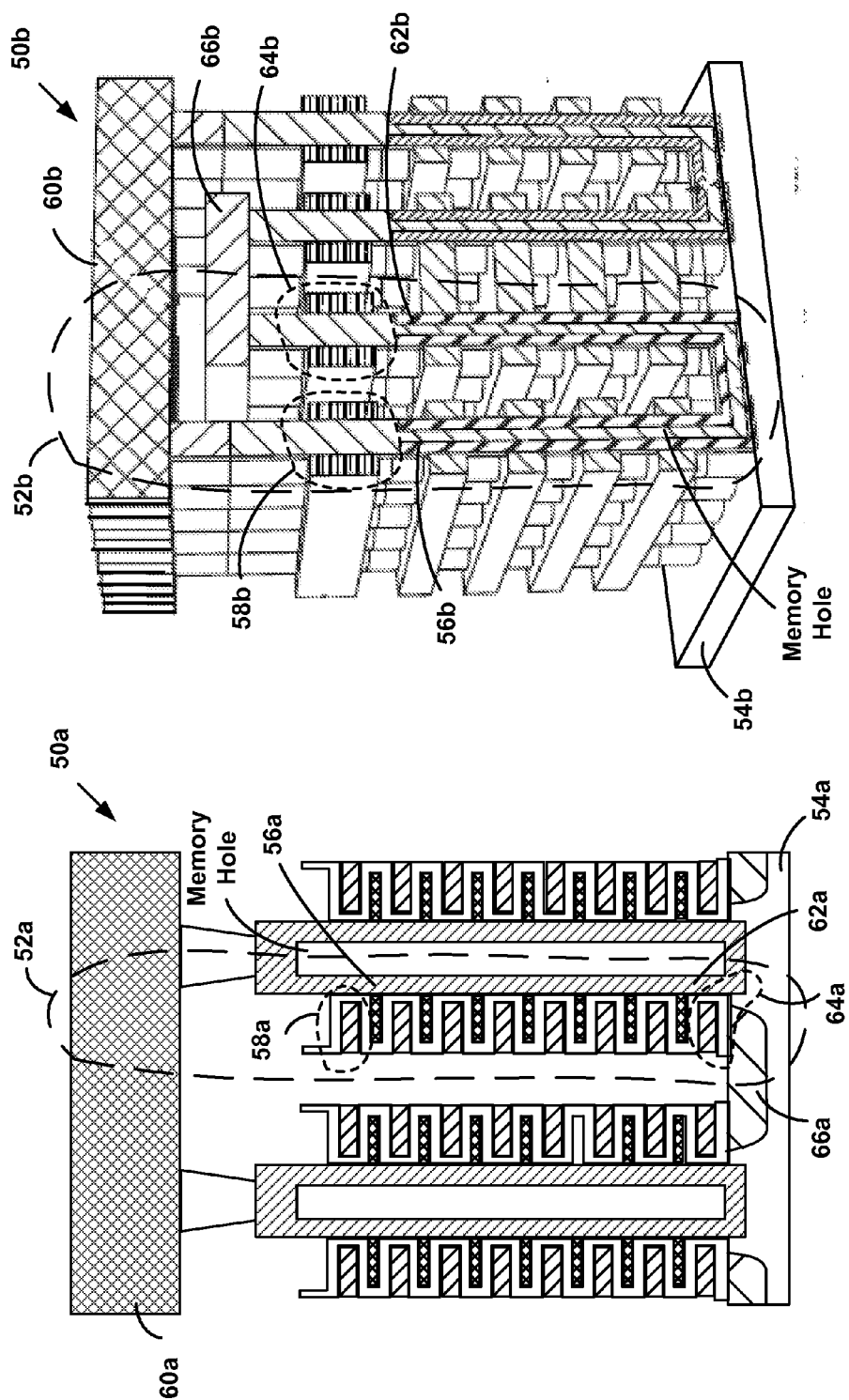
FIGS. 5A and 5B are cross-sectional and perspective views of a three-dimensional NAND memory array.

FIGS. 5A-5B depict a three-dimensional NAND stacked non-volatile memory device including an array of alternating conductive and dielectric layers disposed above a substrate as may also be used in accordance with one embodiment. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 5A illustrates a TCAT (Terabit Cell Array Transistor) array 50a, and FIG. 5B illustrates a BiCS (Bit Cost Scalable) array 50b. TCAT array 50a includes a NAND string 52a disposed above a substrate 54a. NAND string 52a has a drain end 56a coupled via SGD 58a to a bit line 60a, and a source end 62a coupled via SGS 64a to a source line 66a. BiCS array 110b includes a NAND string 112b disposed above a substrate 114b. NAND string 52b has a drain end 56b coupled via SGD 58b to a bit line 60b, and a source end 62b coupled via SGS 64b to a source line 66b.

Select gates SGD 116a and SGS 120a, and SGD 16b and SGS 120b are implemented above substrates 114a and 114b, respectively. SGD 116a and SGS 120a, and SGD 116b and SGS 120b consume a significant amount of area. Other 3D NAND non-volatile memory devices may include select gate transistors (SGD or SGS) disposed in the substrate below the NAND strings. In particular, 3D NAND memory arrays may include buried word lines as selector devices of select gate transistors (SGD or SGS).

One approach to erasing in a 3D stacked non-volatile memory device is to generate gate induced drain leakage (GIDL) current to charge up the NAND string channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Figure 6:
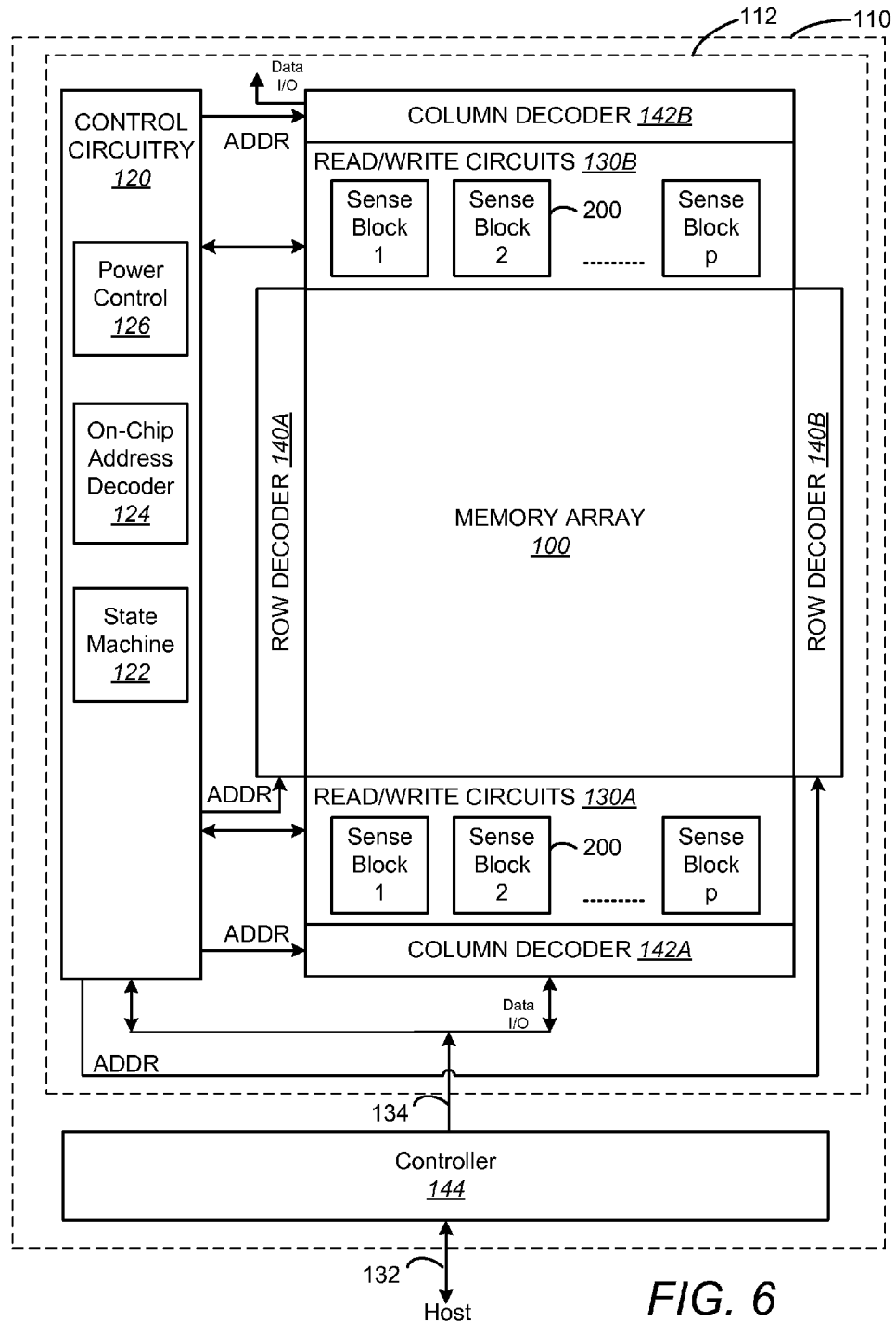
FIG. 6 is a block diagram of a non-volatile memory system in accordance with one embodiment.

FIG. 6 illustrates a memory device 110 having read/write circuits for reading and programming a page of memory cells in parallel. Memory device 110 may include one or more memory die or chips 112. Memory die 112 includes a two-dimensional or three-dimensional array of memory cells 100. Control circuitry 120 and read/write circuits 130A and 130B are provided. In the embodiment of FIG. 6, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations. Managing circuitry for memory array 100 can be considered to comprise one or more of the control circuitry 120, row decoders 140, column decoders 142, read/write circuits 130, or controller 144, for example.

Figure 7:
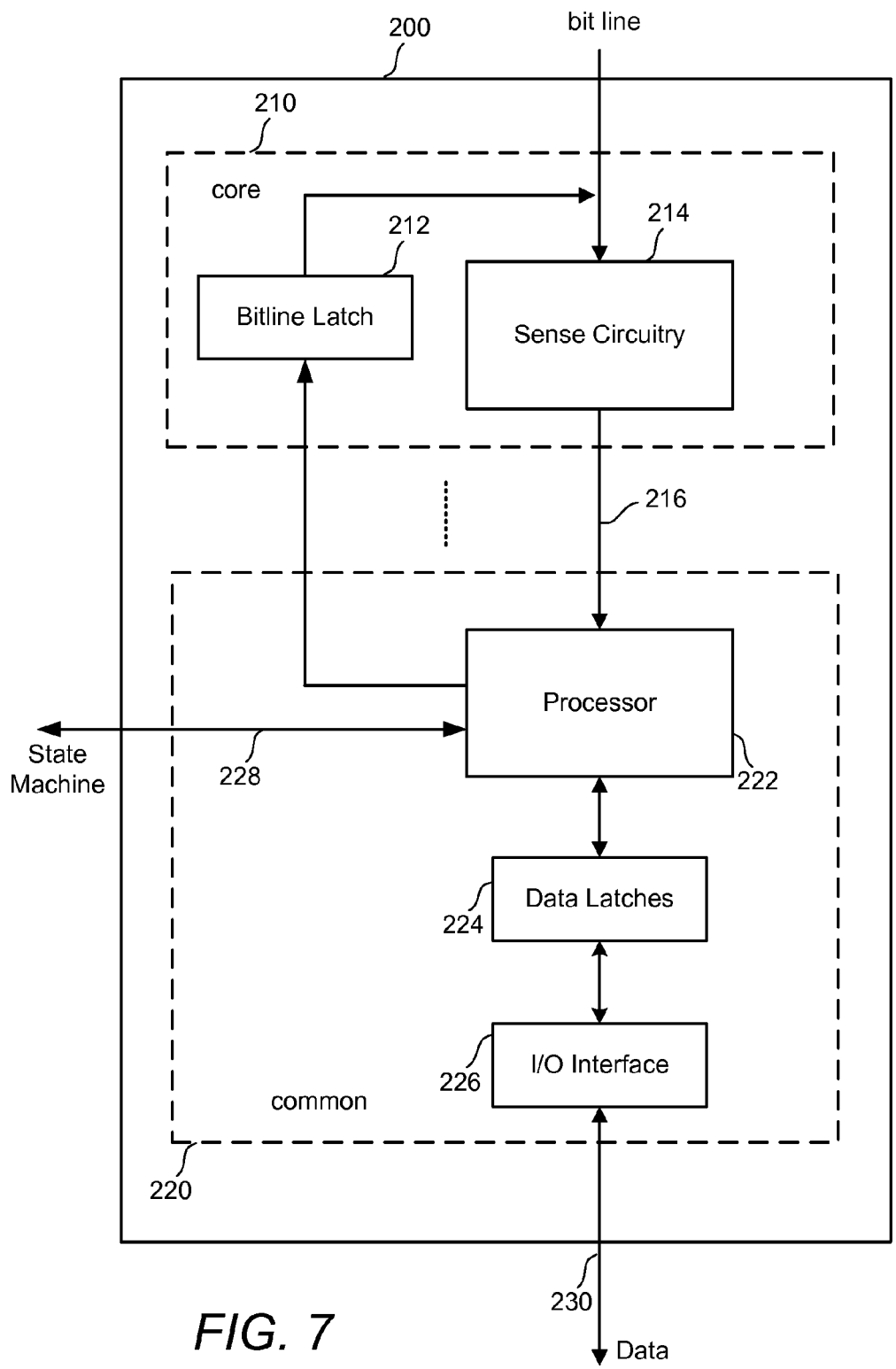
FIG. 7 is a block diagram of a sense block in accordance with one embodiment.

FIG. 7 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., $V_{DD}$).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. During convention sensing, the state machine steps through the various predefined control gate voltages corresponding to the various memory states supported by the memory. The sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 8A:
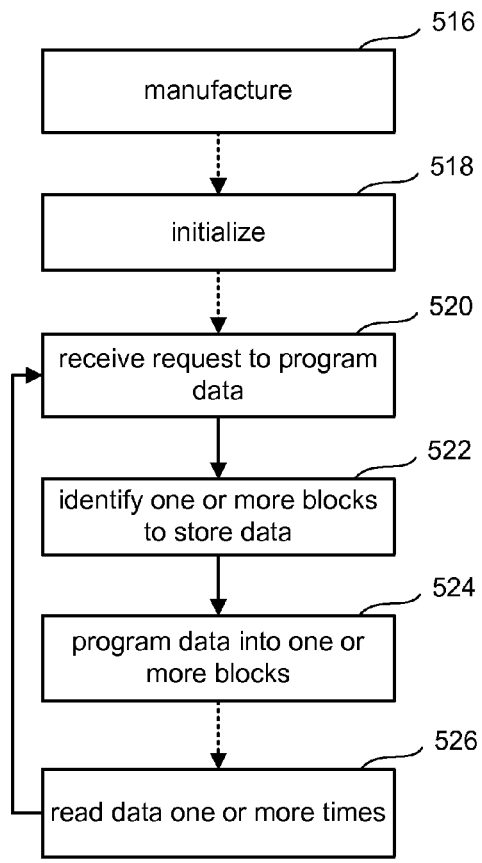
FIG. 8A is a flow chart describing one embodiment of a process for making and operating a non-volatile memory system.

FIG. 8A is a flow chart describing one embodiment of a process for making and operating a non-volatile storage system. In step 516, the non-volatile storage system is manufactured. This includes testing and (optionally) pre-loading data. In step 518, the non-volatile storage system is initialized, which can include any one or combination of powering on, configuring, waking from sleep mode, first use, or other initialization event. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The programming and reading can be performed multiple times, in any order.

The dashed line between steps 516 & 518, 518 & 520 and 524 & 526 indicates that there can be an unpredictable amount of time between the steps. Note that the steps of the process of FIG. 8A (as well as the other processes in the other Figures) need not be performed by the same entity, or in the same order as depicted.

Figure 8B:
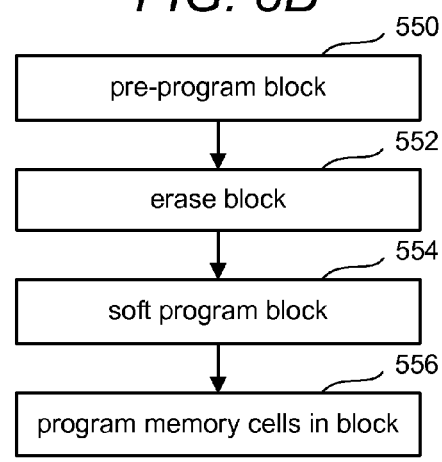
FIG. 8B is a flow chart describing one embodiment of a process for programming data into a block of memory cells.

FIG. 8B is a flow chart describing a process for programming a block of memory. The process of FIG. 8B is performed one or more times during step 524 of FIG. 8A. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Former-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 8B can be performed at the direction of the Controller using the various circuits described above.

At the end of a successful programming process (with verification), the threshold voltages of the memory cells should be within one or more distributions of threshold voltages for programmed memory cells or within a distribution of threshold voltages for erased memory cells, as appropriate.

Figure 9:
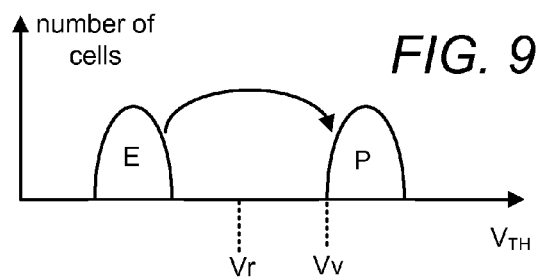
FIG. 9 depicts an example set of threshold voltage distributions and describes a process for programming non-volatile memory.

FIG. 9 illustrates example threshold voltage distributions for the memory cell array when each memory cell stores one bit of data. Other embodiments, however, may use more than one bit of data per memory cell (e.g., such as two, three, or four bits of data per memory cell). FIG. 8 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 9 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 10:
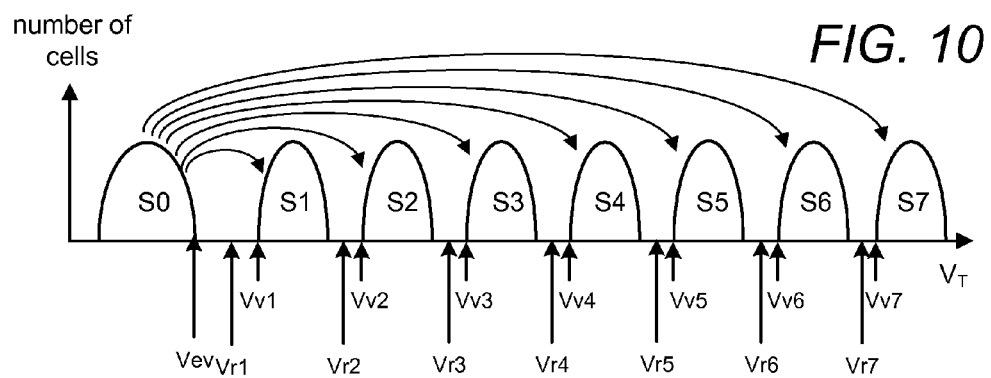
FIG. 10 depicts an example set of threshold voltage distributions and describes a process for programming non-volatile memory.

FIG. 10 illustrates example threshold voltage distributions for the memory cell array when each memory cell stores three bits of data. Other embodiments, however, may use more or less than three bits of data per memory cell (e.g., such as three bits of data per memory cell). In the example of FIG. 10, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multistate flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 10.

FIG. 10 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 10 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 10) or verify operation (e.g. see verify target levels Vv1, Vv2, Vv3, Vv4, Vv5, Vv6, and Vv7 of FIG. 10) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 11:
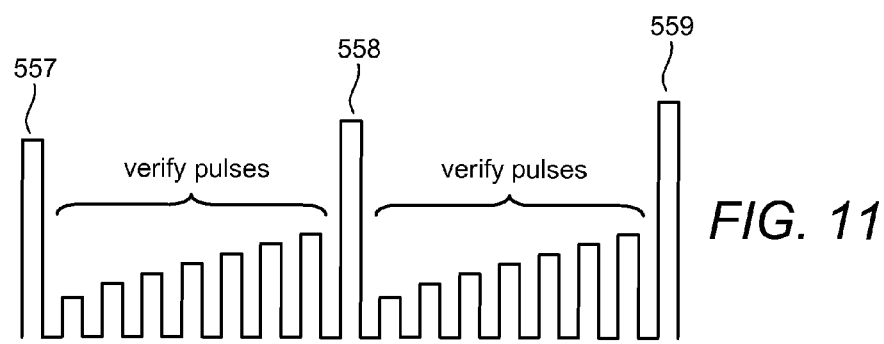
FIG. 11 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line. FIG. 11 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 11 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous.

For example, if none of the memory cells being programmed according to FIG. 0 have reached Vv2, there is no reason to verify at Vv7.

Figures 12A, 12B, 12C, 12D, 12E:
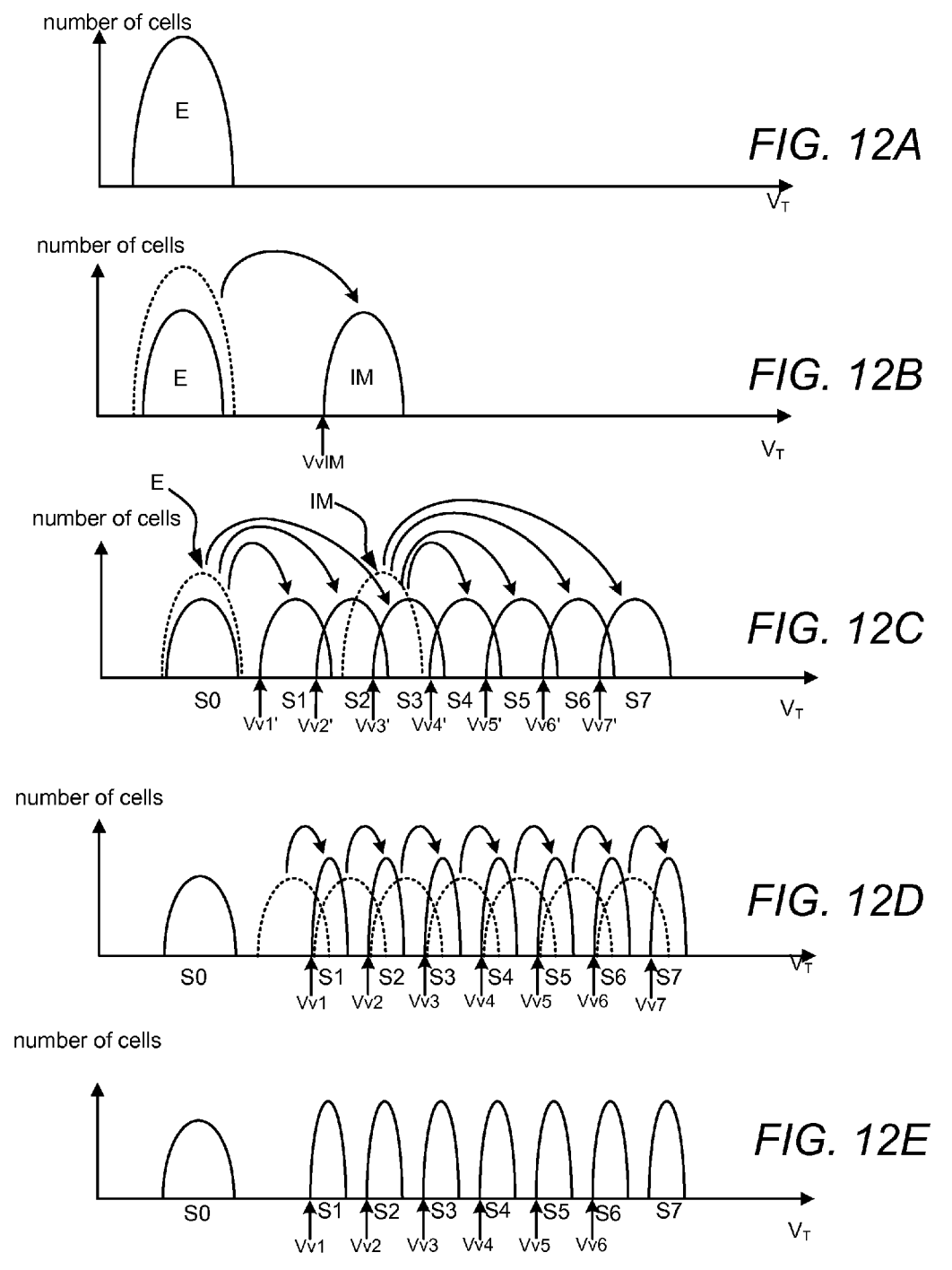

FIG. 10 shows a programming process that includes one phase where all memory cells connected to the same word line are programmed concurrently during that one phase. FIGS. 12A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 12A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 11B. Memory cells being programmed to intermediate state IM are programmed to a target threshold voltage of VvIM.

During the second phase of the programming process of FIGS. 12A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 12C. The second phase of programming may be referred to as a "foggy" programming phase.

As can be seen in FIG. 12C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figures 12F, 13:
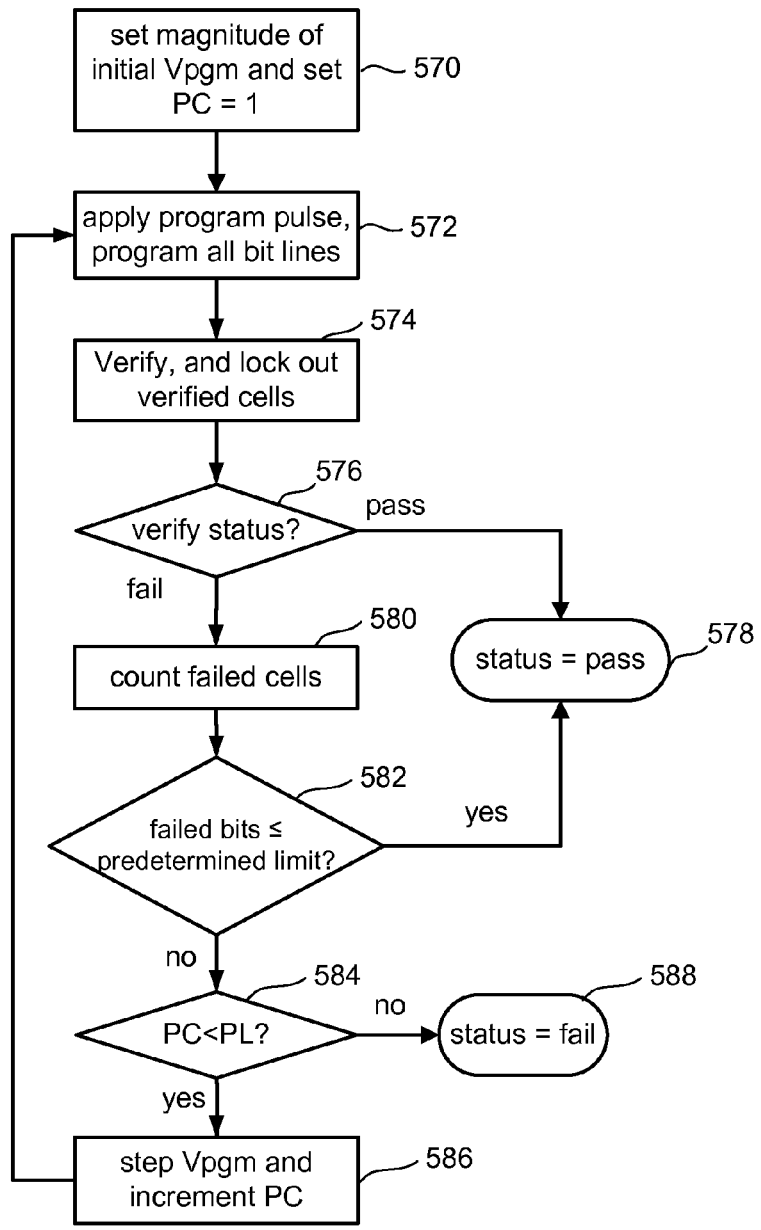
FIG. 12F is a table depicting an example data encoding.
FIG. 13 is a flow chart describing one embodiment of a process for programming non-volatile memory.

In the third phase of programming, each of data states S1-S7 are tightened so that they no longer overlap with neighboring states. This is depicted graphically by FIG. 12D. The final result of the three phrase programming process is depicted in step 11E, which shows data states S0-S7. In some embodiments, data state S0 is wider than data states S1-S7. FIG. 12F shows one example of how data is encoded for the data states of FIGS. 12A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

FIG. 13 is a flow chart describing one embodiment of a process for performing programming on memory cells connected to a common word line to one or more targets (e.g., data states or threshold voltage ranges). The process of FIG. 13 can be performed one or multiple times during step 556 of FIG. 7. For example, the process of FIG. 13 can be used to program memory cells from erased data state E to programmed data state P of FIG. 9; from data state S0 of FIG. 10 to any of data states S1-S7 performing full sequence programming, and any stage of the multi-stage programming process of FIGS. 12A-12E. The process in FIG. 13 may be performed for each word line separately during a programming operation. Moreover, FIG. 13 may be performed for each stage of programming at each word line.

Typically, the program voltage applied to the control gate during a program operation is applied as a series of program pulses. Between programming pulses are a set of verify pulses to perform verification, as depicted (for example) in FIG. 11. In many implementations, the magnitude of the program pulses is increased with each successive pulse by a predetermined step size. In step 570 of FIG. 13, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to VDD to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 14:
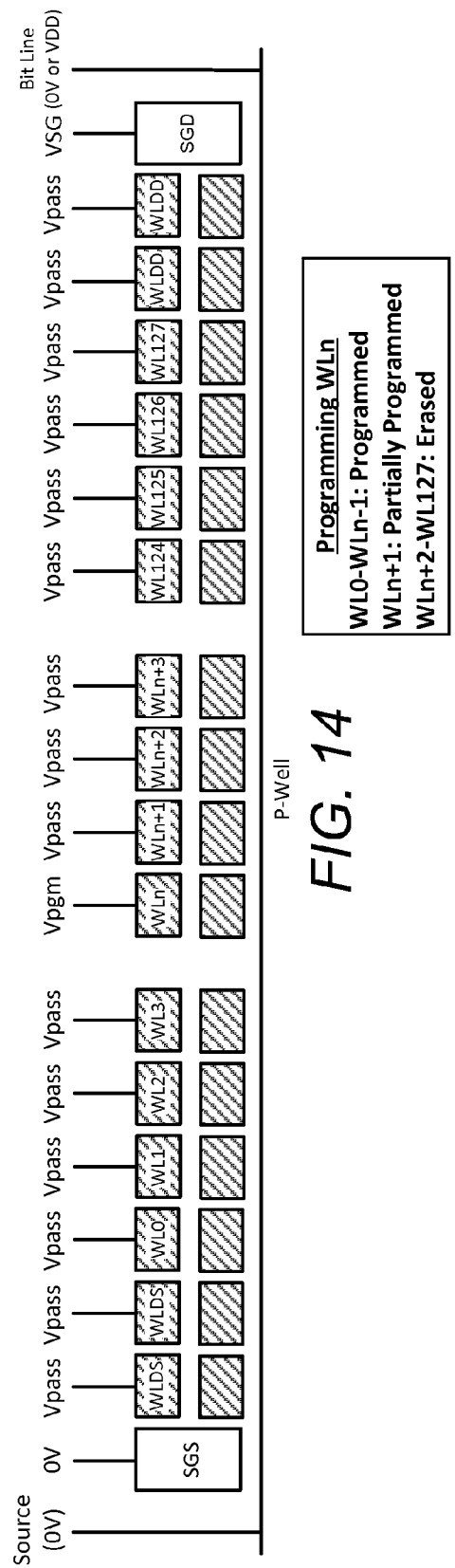
FIG. 14 is a cross-sectional view of a NAND string showing the bias conditions for a programming operation.

FIG. 14 is a cross-sectional view of an example of a NAND string during a programming process. The NAND string in this example includes 128 data word lines per block and four dummy word lines that are not used to store user data. FIG. 14 depicts the bias condition of the NAND string when programming a selected word line WLn. When programming the selected word WLn, a program voltage Vpgm is applied to the control gate and the bit line is grounded. The drain select gate SGD is enabled by applying a select voltage VSG and the source select gate (SGS) is turned off by applying 0V. Electrons from the p-well are injected into the floating gate. When electrons accumulate in the floating gate, the floating gate becomes negatively charged and the threshold voltage of the cell is raised. To apply the program voltage to the control gate of the cell being programmed, the program voltage is applied on the appropriate word line. As discussed above, that word line is also connected to one cell in each of the other NAND strings that utilize the same word line. Programming inhibit is used to enable programming of selected cells on the word line without programming unselected cells connected to the same word line. The unintentional programming of unselected cells is referred to as "program disturb."

Several techniques can be employed to prevent program disturb. FIG. 14 depicts one program inhibit scheme known as "self boosting." The unselected bit lines are electrically isolated by applying VDD (e.g., 2.5V) and a pass voltage Vpass (e.g. 7-10 volts) is applied to the unselected word lines during programming. The unselected word lines couple to the channel and source/drain regions of the NAND strings corresponding to the unselected bit lines, causing a voltage (e.g. eight volts) to be impressed in the channel and source/drain regions of the unselected bit lines, thereby preventing program disturb. Self boosting causes a voltage boost to exist in the channel which lowers the voltage across the tunnel oxide and hence prevents program disturb.

Other boosting techniques may be used. For example, Local Self Boosting ("LSB") and Erased Area Self Boosting ("EASB") both attempt to isolate the channel of previously programmed cells from the channel of the cell being inhibited to maintain a high voltage in the boosted channel. The principle of self-boosting relies on a boosted channel and source/drain region to reduce or eliminate program disturb. A voltage Vpass is applied to each unselected word line in the NAND string. At the same time, the bit line of NAND string 400 is driven with VDD to inhibit programming. The Vpass voltage (e.g., 7-10 volts) will couple to the channel and source/drain regions of the NAND string corresponding to the unselected bit line, and cause a boosted voltage to be impressed in the channel region of the memory cell at the selected word line as well as the source/drain regions of the NAND string. The boosted voltage in the channel lowers the electric field across the tunnel oxide of the unselected memory cells and thus, reduces the potential for inadvertent programming.

Another self-boosting technique is erased area self-boosting (EASB) which attempts to isolate the channel of previously programmed cells from the channel of the cell being inhibited. In EASB, the source side neighboring word line, word line WLn−1 for example, is set to a low voltage (for example 0V), while the remaining non-selected word lines are set to Vpass. The value of Vpass is constrained by considerations of boosting and disturb. A large enough value should be chosen so that boosting in the channel is sufficient to prevent program disturb. However, a low enough value should be chosen so that unselected word lines are not inadvertently programmed (off-row disturb). Local Self Boosting (LSB) is similar to EASB except that both the source and drain side neighbors are set to 0V for the inhibit scheme. The application of 0V to both neighboring word lines will further isolate the region surrounding a selected memory cell.

While the application of Vpass to the unselected word lines is generally effective in suppressing program disturb along the selected word line, it may lead to other disturbances. For example, the application of Vpass may lead to program disturb on the erased word lines (WLn+1 through WL127) by inadvertently soft programming the memory cells coupled to the erased word lines. As shown in FIG. 14, the pass voltage Vpass is applied to the erased word lines during the program operation. The pass voltage Vpass is generally a large voltage sufficient to turn on a memory cell in the highest programmed state to enable sufficient boosting in the NAND string channel. When the high read pass voltage Vpass is applied to the control gate of an erased memory cell, it may inadvertently soft or partially program the erased memory cell by injecting electrons into the erased memory cells, thereby raising their threshold voltage. Because the threshold voltage of the memory cells is raised, these cells are at a higher state level than anticipated before being programmed in response to the programming request. The shift in threshold voltage may be enough to cause cells that are to remain in the erased state after the programming operation to move into the state S1 voltage distribution. This may cause read disturb by causing these cells to be read as in state S1, rather than their intended erased state (or state S0). Additionally, memory cells that are programmed to other states may be over-programmed because the memory cells begin at a higher initial state level.

Figure 15:
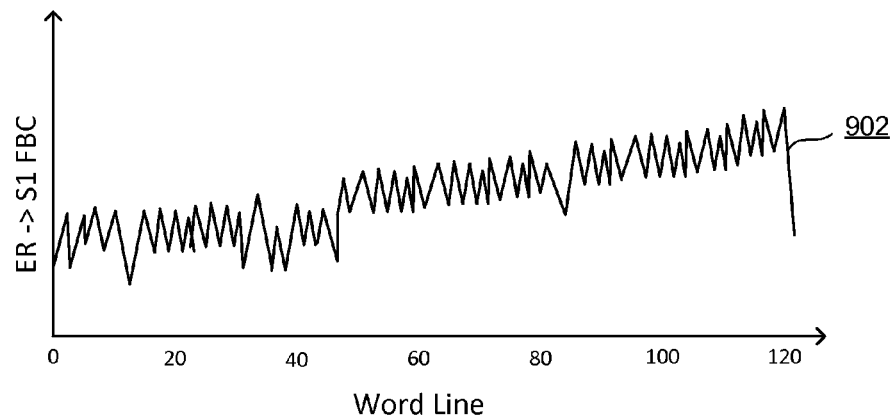
FIG. 15 is a graph illustrating the fail bit count for a group of erased memory cells as a function of word line position.

FIG. 15 is a diagram illustrating the effects of word line dependence of an average fail bit count of a group of memory cells. FIG. 15 is a graph depicting the average fail bit count (FBC) for a group of memory cells when reading from the group of memory cells. The group of memory cells may include one or more blocks of memory cells, for example. The graph includes line 902 which depicts the average fail bit count (FBC) for the group of memory cells as a function of the word line to which each cell is coupled. The graph illustrates that the average FBC for the word lines increases generally from the lower word lines to the upper word lines. FIG. 15 illustrates that program disturb due to Vpass increases as programming progresses from the lower word lines to the upper word lines. The pass voltage that is applied to the unprogrammed memory cells during the read operations causes an increase in threshold voltage that leads to read disturb after programming these memory cells and reading them back later.

As earlier described, the word lines of a block are generally programmed in sequence beginning with WL0 and ending with WL127 (or another final word line of the block). During programming for each word line, the unselected word lines receive the Vpass voltage. The word lines on the drain side of the selected word line are generally in the erased state during programming. The application of Vpass to these unprogrammed memory cells may inadvertently soft program the erased memory cells. The application of Vpass causes the threshold voltage of these memory cells to shift, resulting in a shallower erased state for these cells. The higher word lines receive Vpass more times while in the unprogrammed or erased state than the lower word lines which are programmed earlier in the sequential process. Accordingly, the application of Vpass as shown in FIG. 15 appears to cause a larger average FBC for memory cells inadvertently moving from the erased state to the first programmed state at the higher word lines than at the lower word lines of a block.

Figure 16:
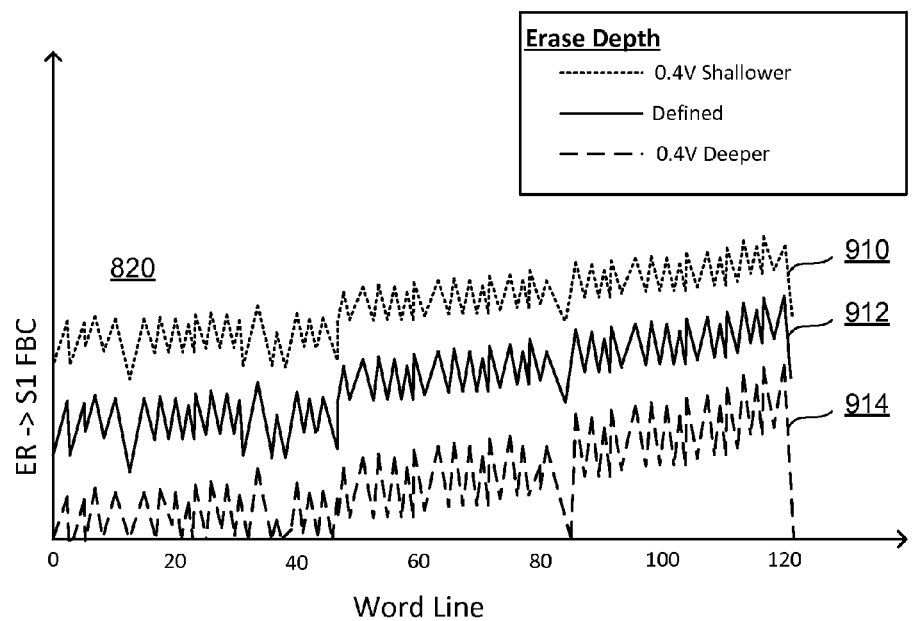
FIG. 16 is a graph illustrating the fail bit count for erased memory cells using three different erase depths.
Figure 17:
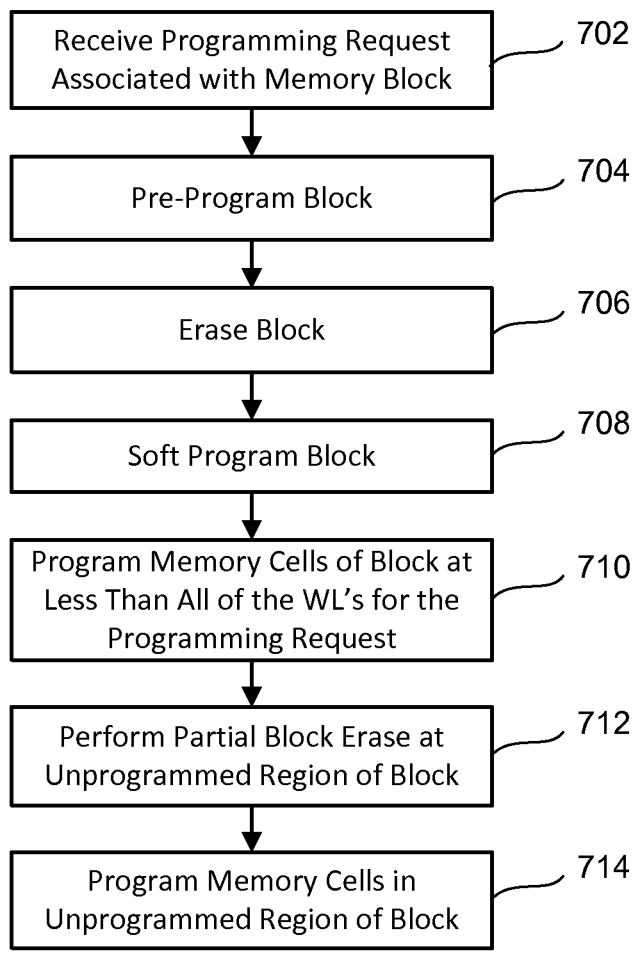
FIG. 17 is a flowchart describing a process of programming non-volatile memory using a partial block erase operation.

FIG. 16 is another diagram depicting the word line dependence of the average fail bit count. In FIG. 17, the group of memory cells are erased to different erase depths before programming to illustrate the effects of erase depth on the average FBC. The solid line 912 depicts the average FBC for the group of memory cells when erased using a predefined erase verify level for the group. As described in FIG. 15, a clear word line dependence of the average FBC can be seen. The average FBC increases as the word line number increases. The dotted line 910 in FIG. 16 depicts the average FBC for the group of memory cells using a shallower erase depth. In this example, the memory cells are erased using an erase verify voltage that is 0.4V shallower than that used for the defined erase verify level shown by the solid line. When a shallower erase depth is used, the average FBC for disturb from the erased state to state S1 increases. FIG. 16 illustrates that a word line dependence still exists for the average FBC. The dashed line 914 depicts the average FBC for the group using a deeper erase depth. In this example, the memory cells are erased using an erase verify voltage that is 0.4V deeper than that used for the defined erased verify level. When a deeper erase depth is used, the average FBC resulting from cells in the erased state inadvertently being programmed to the first programmed state S1 increases for the group of memory cells. Again, the word line dependence remains showing that the average FBC increases as the word lines are programmed from WL0 through WL127.

To mitigate the effects of program disturb on the upper word lines that results from application of a pass voltage while programming the lower word lines, a partial block erase operation is described. The system receives a programming request associated with a group of word lines from a block, such as all or a portion of the word lines of the block. The system erases and soft programs the block prior to beginning programming. The system then programs a subset of the word lines of the block that are needed to complete the programming request. After programming the subset of word lines, the system pauses the programming operation for the block of memory cells. The system performs an erase operation for the unprogrammed word lines of the block prior to continuing the programming process. The already programmed word lines and one or more optional buffer word lines may be inhibited from erasing during the erase operation. After erasing the unprogrammed word lines, the system completes the programming request by programming the remaining user data in the unprogrammed region of the block.

FIG. 17 is a flowchart describing a method of programming a block of memory cells with an intervening partial block erase operation according to one embodiment. At step 702, the memory device receives a programming request from a host device or a controller. The programming request may correspond to the entire memory block or only a portion of the memory block for storing the user data corresponding to the programming request. The memory cells of the block are pre-programmed at step 704, followed by erasing the block at step 706, and soft programming the block at step 708, as earlier described. Steps 702-708 are performed for the entire memory block including all of the word lines of the block.

At step 710, the memory block is programmed. The programming at step 710 is for less than all of the word lines in the block that are needed to complete the programming request at step 702. The managing circuitry programs a predetermined number of the word lines with a subset of the user data for the programming request. After programming the subset of user data in the predetermined number of word lines of the block, the managing circuitry pauses the programming operation.

The managing circuitry then performs a partial block erase operation at step 712 before completing the programming request. The managing circuitry mitigates the effects of Vpass program disturb on the word lines that have yet to be programmed for the programming operation. The managing circuitry may erase all or a portion of the unprogrammed region of the block at step 712 by performing a partial block erase operation. The managing circuitry inhibits word lines in the programmed region of the memory block from being erased. The word lines in the programmed region may be floated or have a positive erase inhibit voltage applied directly to them so that they are inhibited from erase. The managing circuitry may also inhibit one or more word lines in the unprogrammed region of the memory block from being erased.

The erase voltage Verase is applied to the memory block as an erase voltage pulse. In a two-dimensional memory array, Verase may be applied directly to the p-well region for the NAND strings. In a three-dimensional memory array, a positive voltage may be applied to the bit line (and optionally source line) of the NAND string and be transferred to the channel region of the NAND string through the select gates.

After performing the partial block erase operation, the managing circuitry continues programming in response to the programming request at step 714. The managing circuitry programs the memory cells in the unprogrammed region of the memory block to complete the programming request for the memory block. The managing circuitry programs the unprogrammed region of the block using the user data from the programming request. The managing circuitry may also program any partially programmed word lines of the block at step 714.

In FIG. 17, an erase verification is not performed following the partial block erase operation. A single partial block erase operation is able to recover the increase in average FBC that results from Vpass stress in many cases. As such, an erase verification operation need not be performed. In this manner, the overall program time can remain short in order to save programming time. In another embodiment, however, the unprogrammed region of the memory block can be verified for the erased state. The memory cells in the unprogrammed or erased region can be verified for the erased state while excluding memory cells in the already programmed region from verification. Various erase verify pass voltages may be used in the programmed region. If the unprogrammed region is verified for the erased state, the managing circuitry can report a status of pass for the block. If the block does not pass the partial block erase verification, the managing circuitry can perform an additional partial block erase (using a larger Verase, for example). The process can be repeated until the block is verified as erased. A verify counter can be used to limit the number of times the partial block erase and verify is performed.

The value of the erase voltage during the partial block erase may vary. In one example, the erase voltage during a partial block erase is lower than a peak erase voltage used during standard memory block erasing. Because the memory cells in the unprogrammed region have relatively low threshold voltages, a lower erase voltage may be used. In another example, the erase voltage during partial block erase may be equal to or greater than an erase voltage used during standard memory block erasing of the memory.

Figure 18:
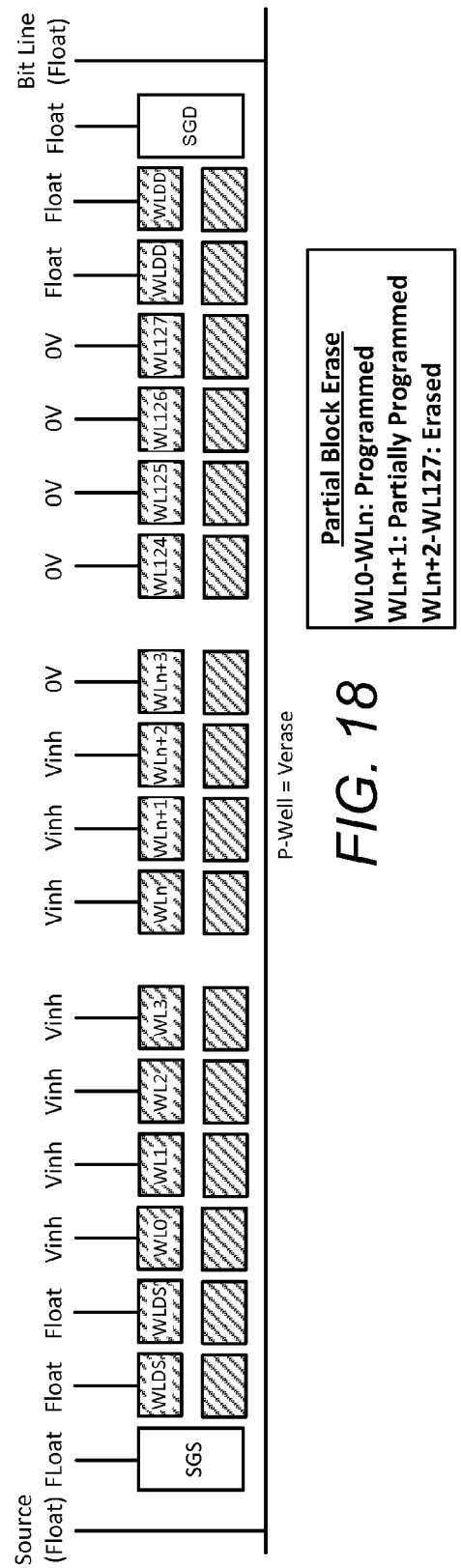
FIG. 18 is a cross-sectional view of a NAND string showing the bias conditions for a partial block erase operation in accordance with one embodiment.

FIG. 18 is a cross-sectional view of the NAND string from FIG. 14 showing the bias condition for a partial block erase operation in accordance with one embodiment. In FIG. 18, word lines WL0-WLn have completed programming of all phases for their final target state. For examples, these word lines may have completed programming for all pages of data being stored in the corresponding word line. Word line WLn+1 is a partially programmed word line that has completed less than all of its intended programming. For example, word line WLn+1 may be programmed with less than all of the pages of data for the word line. Word line WLn+1 may also be programmed in a first or second stage of programming as shown in FIGS. 12A-12E but not in all of the stages targeted for the word line. In other examples, additional word lines may be in partially programmed states and may be biased similarly to WLn+1. The bit and source lines are floating as well as the source and drain select gate lines. The drain side dummy word lines WLDD and source side dummy word lines WLDS are floating. Other examples may not include dummy word lines. In the case of a two-dimensional memory array, the p-well receives the erase voltage Verase which can be applied as one or more pulses having an increasing magnitude with each pulse.

The word lines that have been fully programmed (WL0-WLn) or partially programmed (WLn+1) receive an inhibit voltage Vinh. The erase inhibit voltage may be applied by floating the corresponding word lines in one example. In another example, the inhibit voltage Vinh can be applied directly to the word lines as a positive voltage. Word lines WLn+3 through WL127 in the unprogrammed region of the block are supplied with zero volts or a low bias such as 0.5V to enable erasing for those memory cells. In this example, WLn+2 which is adjacent to partially programmed WLn+1, also receives the inhibit voltage Vinh. By floating WLn+2, an unintentional soft erase of WLn and/or WLn+1 can be avoided. In another example, WLn+2 can be erased by grounding or applying 0V.

Under the applied bias conditions, all or a subset of the word lines in the unprogrammed region of the block will be erased while the word lines in the programmed region of the block are inhibited from being erased. Electrons are transferred from the floating gates of each memory cell in the unprogrammed region set by virtue of the potential created by applying 0V to the word lines and Verase to the p-well. To inhibit erasing of the already programmed memory cells, the word lines in the programmed region are floated or supplied with a positive voltage while the word lines in the unprogrammed region are provided with 0V. If floated, the word lines in the programmed region will couple to the p-well and create little to no erase potential across the tunnel dielectric region of the memory cells. Another possible technique is to apply a positive voltage at or near the potential of the erase voltage Verase to inhibit erasing of the word lines in the programmed region. The positive voltage will create little or no erase potential across the tunnel dielectric region to draw electrons to the p-well from the floating gate. By supplying 0V to the word lines in the unprogrammed region, those memory cells will be enabled for erasing. Thus, just the memory cells in the unprogrammed region are erased when the erase voltage pulse is applied to the p-well to facilitate a partial block erase.

In a three-dimensional array, the word lines may be biased for a partial block erase in the same manner as shown in FIG. 18. One approach to erasing in a 3D non-volatile memory is to generate gate induced drain leakage (GIDL) to charge up the NAND string channel, raise the channel potential to an erase voltage, and maintain this channel potential during erase. In one example, the memory device includes NAND strings that have a drain-side select gate SGD transistor and a source-side select gate SGS transistor. The erase may be a one-sided erase or a two-sided erase. When a voltage (e.g., erase voltage) is applied to the bit line in a one-sided erase, the select gate transistors generate a sufficient amount of gate-induced drain leakage (GIDL) current to charge up the floating body (channel) of the NAND string. A voltage can be applied to the bit line and the source line in a two-sided erase to generate gate-induced drain leakage at the drain-side select gate. GIDL increases in proportion to the drain-to-gate voltage (Vdg) of the select gate transistors.

Figure 19:
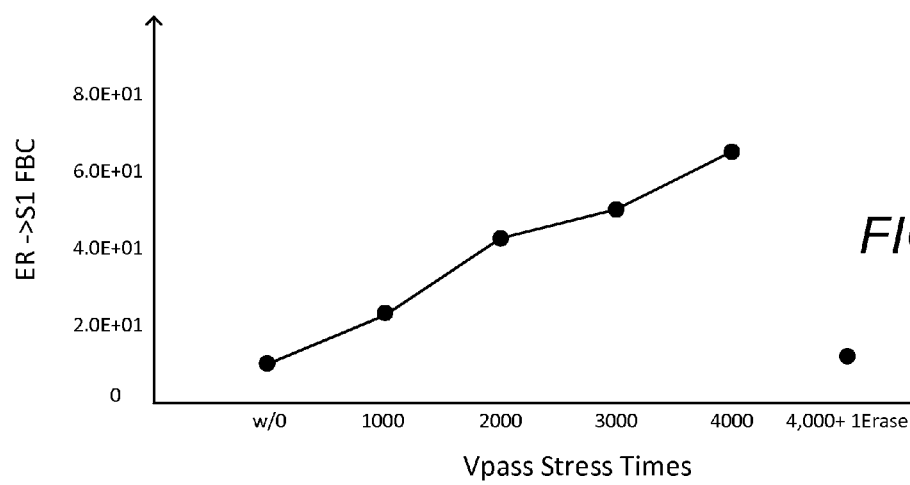
FIG. 19 is a graph illustrating the fail bit count for a group of erased memory cells as a function of a pass voltage stress and partial block erase.

FIG. 19 is a diagram illustrating the effects of Vpass stress on a group of a memory cells and the effects of a partial block erase operation. FIG. 19 is a graph depicting the average fail bit count (FBC) for the group of memory cells as a function of the Vpass stress time applied to the word lines of the group. In FIG. 19, the group of memory cells undergoes application of Vpass during a programming operation. FIG. 19 shows how the number of times Vpass is applied to a word line affects the average FBC for the group of memory cells. Without application of Vpass to the word lines, the average FBC (reading an erased cell as state S1) is about 1.0E+01. With application Vpass 1,000 times, the average FBC increases to a little over 2.0E+01. With application of Vpass 2,000 times, the average FBC jumps from 2.0E+01 to just over 4.0E+01. With 3,000 applications of Vpass, the average FBC is about 5.0E+01 and with 4,000 applications it is a little over 6.0E+01. The graph illustrates that the average FBC for the word lines increases as the number of applications of the Vpass stress to the word lines increases.

FIG. 19 also shows the average FBC for the group of memory cells after 4,000 applications of Vpass, followed by one partial block erase operation as shown in FIG. 18. The average FBC falls to about the starting level with no applications of Vpass. The average FBC is back to about 1.0E+01, close to where it was before beginning application of Vpass. Accordingly, the use of a single partial block erase operation can recover the increase in average FBC that results from Vpass programming stress.

Figure 20:
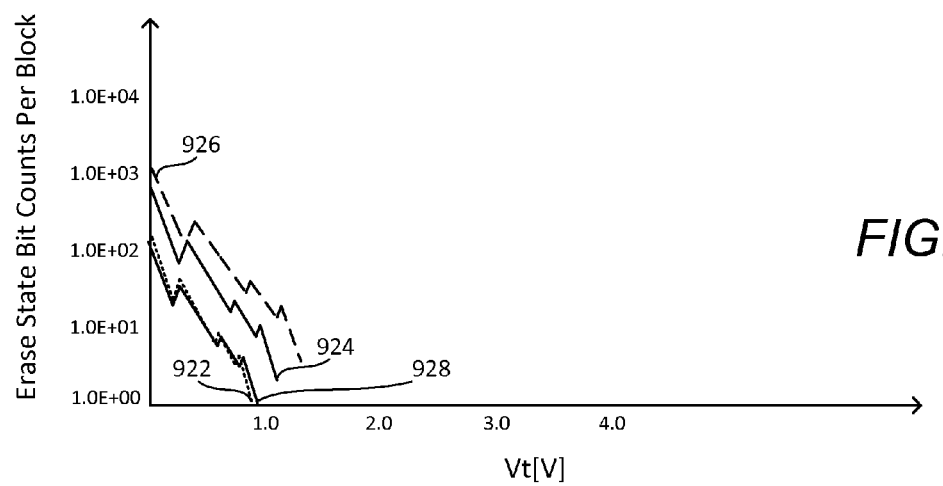
FIG. 20 is a graph illustrating an erase state bit count as a function of threshold voltage for various pass voltage stress counts and partial block erase.

FIG. 20 is a diagram illustrating the effects of a partial block erase operation. FIG. 20 is a graph depicting the number of erased state bits per block as a function of the measured threshold voltage of the memory cells. In FIG. 20, the number of erased state bits as a function of threshold voltage for the group of memory cells without any Vpass stress is shown as dotted line 922. The number of erased state bits as a function of threshold voltage after 1,000 applications of Vpass is shown as solid line 924, and the number after 4,000 applications of Vpass is shown as dashed line 926. FIG. 20 illustrates that the threshold voltage for the erased state memory cells increases in relation to the number of times Vpass is applied.

FIG. 20 also shows the number of erased state bits as a function of threshold voltage after 4,000 applications of Vpass, followed by one partial block erase operation. The threshold voltages of the memory cells is decreased to about the initial threshold voltages before applying Vpass. Solid line 928 illustrates the erased state bit count after one partial block erase operation following 4,000 applications of Vpass. FIG. 20 illustrates that the use of a single partial block erase operation can recover the increase in threshold voltage that results from Vpass programming stress.

Figure 21:
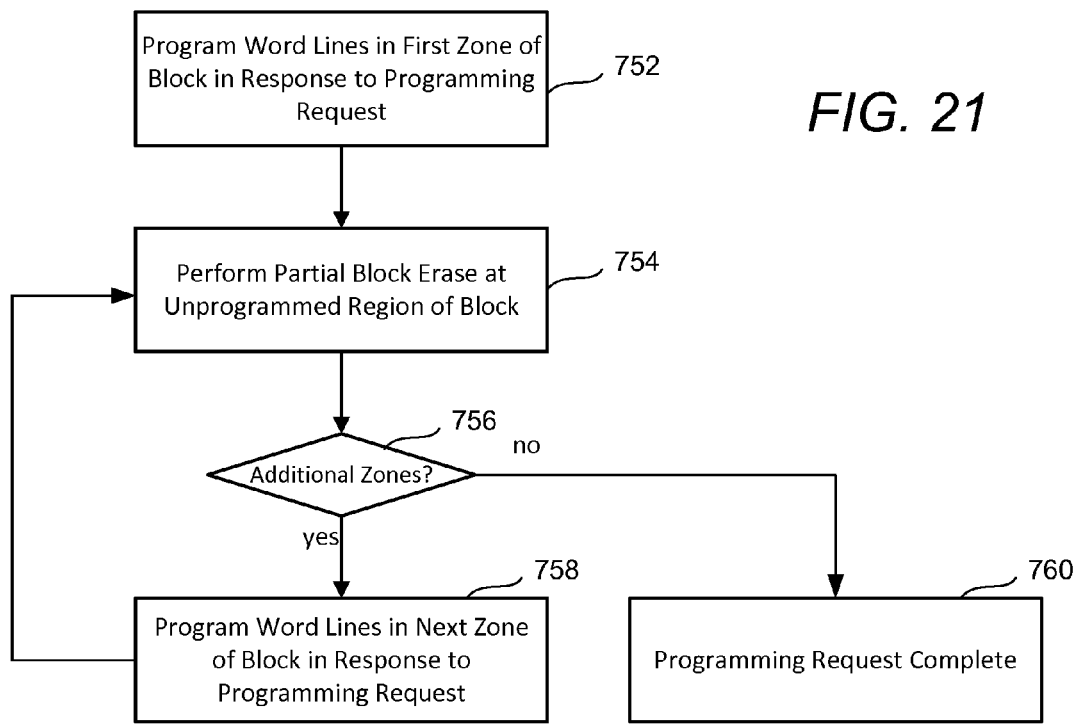
FIG. 21 is a flowchart describing a process of programming non-volatile memory using a partial block erase operation for multiple zones.

FIG. 21 is a flowchart describing a process of programming with partial block erase to mitigate the effects of Vpass program disturb on a subset of word lines in the block. In FIG. 21, a variation to the process of FIG. 17 is described where multiple partial block erase operations may be performed when programming a memory block. The managing circuitry divides or otherwise partitions the memory block into three or more zones that are programmed individually in response to programming requests. After programming the word lines in each of the zones, the unprogrammed zones are erased by partial block erase before continuing programming. In one example, the process in FIG. 21 may be performed as part of steps 710-714 in FIG. 17.

At step 752, the managing circuitry programs the word lines in a first zone of the memory block in response to a programming request. The first zone includes the first word line to be programmed for the memory block (e.g., WL0) and a set of additional contiguous word lines from the memory block. The managing circuitry programs a first subset of the user data for the programming request at step 752.

At step 754, the managing circuitry erases the word lines in the unprogrammed region of the memory block. Step 754 includes erasing the word lines in two or more additional zones of the memory block. At step 754, the managing circuitry erases the unprogrammed region of the memory block while inhibiting the programmed region of the memory block from being erased.

At step 756, the managing circuitry determines if the zone programmed at step 752 (or step 758) was the last zone in the memory block to complete the programming request. If the zone was the last to be programmed for the memory block, the managing circuitry reports a status of pass for the programming operation at step 760 and the programming request is complete. If there are additional zones to be programmed for the programming request, the managing circuitry programs the next zone of the memory block with a second subset of the user data for the programming request at step 758. After programming the next zone at step 758, the managing circuitry performs an additional partial block erase operation at step 754. The managing circuitry during subsequent iterations of step 754 erases the remaining unprogrammed region of the memory block while inhibiting any previously programmed regions of the memory block from being erased. After performing the additional partial block erase operation at step 754, the managing circuitry returns to step 756 to determine if additional zones are to be programmed for the memory block.

The number of zones in the memory block may vary. For example, the memory block may be divided into any number of two or more zones for individual programming and partial block erase verification of the unprogrammed region. By increasing the number of zones, an additional improvement in the average FBC can be expected as the memory cells are more likely to remain the erased state following any previous programming.

The number of zones may also vary over time. For example, the memory device may utilize standard programming without partial block erasing when a device is relatively new. Over time, the device may switch to zone-based programming followed by partial block erase. Additionally, the device may increase the number of zones over time to provide more precise erase levels as the device ages and performance decreases.

Figure 22:
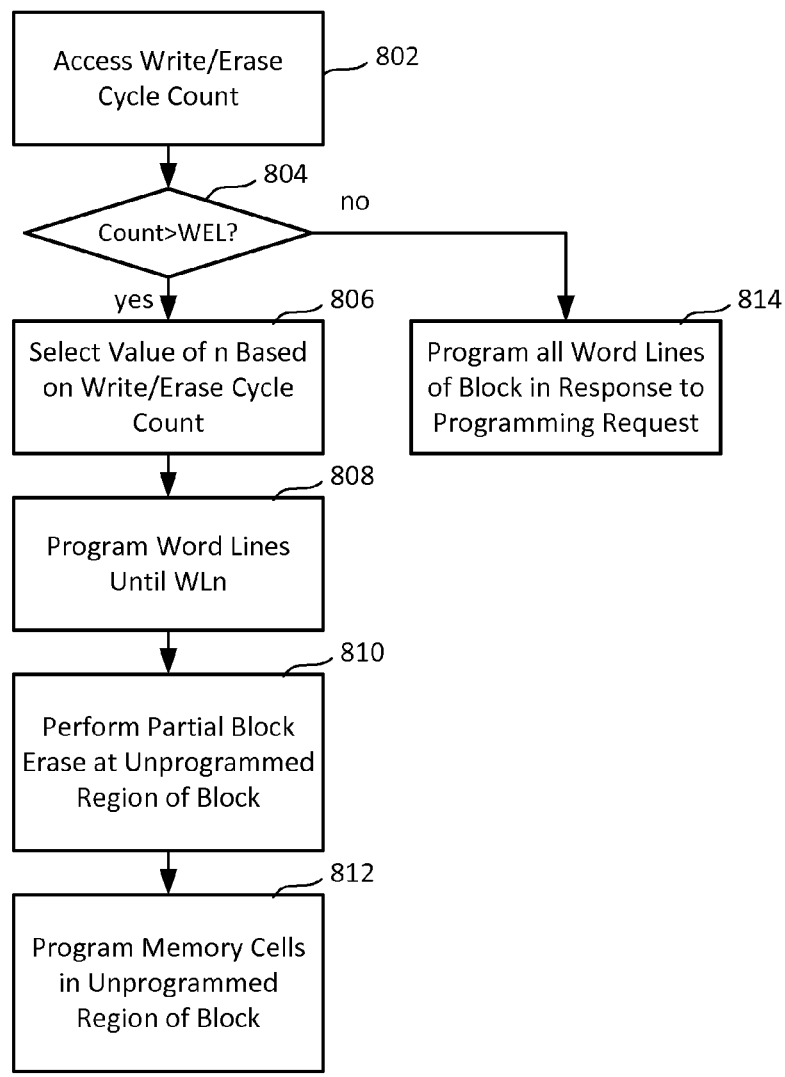
FIG. 22 is a flowchart describing a process of programming non-volatile memory using a partial block erase operation based on write/erase cycling of a the memory.

FIG. 22 is a flowchart describing another process of programming with partial block erase. In FIG. 22, a variation to the process of FIG. 17 is described where partial block erasing is dependent upon the number of write/erase cycles the memory block has undergone. During early life conditions, partial block erase may not be used. As the device ages, partial block erase may be used. Moreover, the value of n used to establish partial block erase zones may vary over time based on write/erase cycles in one example. In one example, the process in FIG. 22 may be performed as part of steps 710-714 in FIG. 17.

At step 802, the managing circuitry accesses a write/erase cycle count. The write/erase cycle count is a measure of the number of times the memory block has been programmed and erased. The write/erase cycle count is indicative of an amount of wear and stress that has been placed on a device.

At step 804, the write/erase cycle count is compared with a threshold such as a write/erase limit (WEL). If the cycle count is less than or equal to the write/ease limit, the managing circuitry programs the memory block with the user data for the programming request at step 814. The managing circuitry does not use partial block erase at step 814, and instead programs the entire memory block to complete the programming request for the block. Because the write/erase cycle count is low, the memory device does not utilize partial block erase in an effort to reduce programming time.

If the write/erase cycle count is greater than the write/erase limit WEL, the managing circuitry selects a value of n based on the write/erase cycle count. Step 806 is optional. The value of n is the number of word lines of the memory block that will be programmed before performing a partial block erase. In one example, the managing circuitry uses the same value of n whenever partial block erase is performed. In another example, however, the value of n may decrease as the write/erase cycle count increases. In this manner, the number of word lines programmed before erasing the unprogrammed region will be less. This can lead to more precise erase levels to maintain average FBC levels as the device ages. In one embodiment, the managing circuitry can vary the value of n with a multi-zone approach as described in FIG. 21. For example, the managing circuitry may decrease the value of n and increase the number of zones as the device ages.

At step 808, the managing circuitry programs the word lines up until the word line WLn that is selected at step 806. After programming the word lines based on the value of n, the managing circuitry performs a partial block erase operation at step 810. The managing circuitry erases the unprogrammed region of the block while inhibiting any programmed regions of the block from being erased. At step 812, the managing circuitry programs the memory cells in the unprogrammed region of the memory block to complete the programming request.

Accordingly, a non-volatile storage device is described that includes a plurality of NAND strings including non-volatile storage elements, a plurality of word lines in communication with the plurality of NAND strings, and managing circuitry in communication with the plurality of NAND strings and the plurality of word lines. The managing circuitry is configured to receive a programming request associated with the plurality of word lines and to program a first group of the word lines with a first portion of user data for the programming request. The managing circuitry is configured to erase a second group of the word lines while inhibiting the first group of word lines from being erased after programming the first group of word lines and to program the second group of word lines with a second portion of the user data after erasing the second group of word lines.

A method is described that includes receiving a programming request having user data to be programmed for a plurality of word lines in communication with a plurality of NAND strings, programming a first group of the word lines with a first portion of the user data for the programming request, erasing a second group of the word lines while inhibiting the first group of word lines from being erased after programming the first group of word lines, and programming the second group of word lines with a second portion of the user data after erasing the second group of word lines.

A method is described that includes receiving a first programming request including user data associated with a block of non-volatile storage elements including a plurality of NAND strings, determining a number of write/erase cycles associated with the block of non-volatile storage elements, and if the number of write/erase cycles is less than a threshold, responding to the first programming request by programming a first group of the word lines of the block with a first portion of the user data before erasing and programming a second group of the word lines of the block with a second portion of the user data. If the number of write/erase cycles is greater than the threshold, the method includes responding to the first programming request by programming a third group of the word lines of the block with a third portion of the user data before erasing and programming a fourth group of the word lines of the block with a fourth portion of the user data. The first group of word lines includes a larger number of word lines than the third group of word lines and the second group of word lines includes a smaller number of word lines than the fourth group of word lines.

A non-volatile storage device is described that includes a block of non-volatile storage elements including a plurality of NAND strings and a plurality of word lines in communication with the plurality of NAND strings. The storage device includes managing circuitry in communication with the block of non-volatile storage elements. The managing circuitry is configured to receive a programming request associated with the block of non-volatile storage elements and determine whether a number of write/erase cycles associated with the block is above a threshold. The managing circuitry is configured to program a first group of the word lines before erasing and programming a second subset of the word lines to complete the programming request if the number of write/erase cycles is above the threshold. The managing circuitry is configured to program the plurality of word lines in a continuous program sequence to complete the programming request if the number of write/erase cycles is below the threshold.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:
1. A non-volatile storage device, comprising:
a plurality of NAND strings including non-volatile storage elements;

a plurality of word lines in communication with the plurality of NAND strings; and managing circuitry in communication with the plurality of NAND strings and the plurality of word lines; the managing circuitry is configured to respond to a programming request associated with user data for the plurality of word lines by programming a first group of the word lines with a first portion of the user data for the programming request, erasing a second group of the word lines while inhibiting the first group of word lines from being erased after programming the first group of word lines, and programming the second group of word lines with a second portion of the user data after erasing the second group of word lines.

2. The non-volatile storage device of claim 1, wherein:
the managing circuitry is configured to erase a third group of the word lines while inhibiting the first group and the second group from being erased after programming the first and the second group of word lines; and
the managing circuitry is configured to program the third group of word lines with a third portion of the user data after erasing the third group.

3. The non-volatile storage device of claim 1, wherein:
the managing circuitry is configured to erase the plurality of word lines in response to the programming request prior to programming the first group of word lines.

4. The non-volatile storage device of claim 3, wherein:
the managing circuitry is configured to erase the plurality of word lines using a first series of one or more erase voltage pulses having a first final erase voltage pulse; and
the managing circuitry is configured to erase the second subset of word lines using a second series of one or more erase voltage pulses having a second final erase voltage pulse that is less than or equal to the first final erase voltage pulse of the first series.

5. The non-volatile storage device of claim 3, wherein:
the managing circuitry is configured to erase the plurality of word lines using a first series of one or more erase voltage pulses having a first final erase voltage pulse; and
the managing circuitry is configured to erase the second subset of word lines using a second series of one or more erase voltage pulses having a second final erase voltage pulse that is greater than the first final erase voltage pulse of the first series.

6. The non-volatile storage device of claim 1, wherein:
the managing circuitry is configured to erase the second group of the word lines without erase verification.

7. The non-volatile storage device of claim 1, wherein:
the managing circuitry is configured to erase the second group of word lines while inhibiting the first group of word lines from being erased by erasing a second set of non-volatile storage elements from each of the NAND strings while inhibiting a first set of non-volatile storage elements from each of the NAND strings from being erased.

8. The non-volatile storage device of claim 7, wherein the managing circuitry is configured to erase the second group of word lines while inhibiting the first group of word lines from being erased by:
floating the first group of word lines;
providing a low bias or zero volts to the second subset of word lines; and
providing a positive voltage to the plurality of NAND strings.

9. The non-volatile storage device of claim 8, wherein:
the plurality of NAND strings are formed in a two dimensional memory array using a substrate; and
the managing circuitry is configured to provide the positive voltage to the plurality of NAND strings by applying one or more positive erase voltage pulses to a channel of each NAND string in the substrate.

10. The non-volatile storage device of claim 8, wherein:
the plurality of NAND strings are vertical NAND strings in a three dimensional memory array formed above a substrate;
the plurality of NAND string are coupled to a plurality of bit lines; and
the managing circuitry is configured to provide the positive voltage to the plurality of NAND strings includes applying one or more positive erase voltage pulses to the plurality of bit lines.

11. The non-volatile storage device of claim 1, wherein:
the programming request is a second programming request and the user data is second user data;
the first group of word lines includes a first number of word lines;
the managing circuitry is configured to receive a first programming request before the second programming request that is associated with first user data;
the managing circuitry determines whether a number of write/erase cycles is below a threshold in response to the first programming request; and
if the number of write/erase cycles is below the threshold, the managing circuitry is configured to program the plurality of word lines with the first user data without erasing the second subset of word lines after programming the first subset of word lines.

12. The non-volatile storage device of claim 1, wherein:
the managing circuitry is configured to inhibit one or more additional word lines of the plurality of word lines from being erased while erasing the second group of word lines; and
the managing circuitry is configured to program the one or more additional word lines with a third portion of the user data after erasing the second group of word lines.

13. The non-volatile storage device of claim 12, further comprising:
a plurality of bit lines coupled to a drain select gate for each NAND string;
a common source line coupled to a source select gate for each NAND string;
wherein the first group of word lines includes word lines closer to the source select gate than the second group of word lines;
wherein the one or more additional word lines are positioned between the first group of word lines and the second group of word lines.

14. The non-volatile storage device of claim 13, wherein:
the first subset of word lines includes a last word line adjacent to the one or more additional word lines that is programmed with a first page of the user data when programming the first subset of word lines; and
the managing circuitry is configured to program the last word line of the first subset of word lines with a second page of the user data after erasing the second subset of word lines.

15. A non-volatile storage device, comprising:
a plurality of NAND strings including non-volatile storage elements;
a plurality of word lines in communication with the plurality of NAND strings; and managing circuitry in communication with the plurality of NAND strings and the plurality of word lines; the managing circuitry is configured to receive a first programming request associated with the plurality of word lines, the managing circuitry is configured to program a first group of the word lines including a first number of word lines with a first portion of first user data for the programming request, the managing circuitry is configured to erase a second group of the word lines while inhibiting the first group of word lines from being erased after programming the first group of word lines and to program the second group of word lines with a second portion of the user data after erasing the second group of word lines;

the managing circuitry is configured to receive a second programming request after the first programming request that is associated with second user data;

the managing circuitry is configured to program a third group of the word lines with a first portion of the second user data before erasing a fourth group of the word lines while inhibiting the third group of word lines from being erased and programming the fourth group of word lines with a second portion of the second user data;

the third group of word lines includes a third number of word lines that is greater than the first number or word lines; and the third group of word lines includes the first group of word lines.

16. A method, comprising:
receiving a programming request having user data to be programmed for a plurality of word lines in communication with a plurality of NAND strings;
programming a first group of the word lines with a first portion of the user data in response to the programming request;
erasing a second group of the word lines while inhibiting the first group of word lines from being erased after programming the first group of word lines in response to the programming request; and
programming the second group of word lines with a second portion of the user data after erasing the second group of word lines in response to the programming request.

17. The method of claim 16, further comprising:
inhibiting one or more additional word lines of the plurality of word lines from being erased while erasing the second group of word lines; and
programming the one or more additional word lines with a third portion of the user data after erasing the second group of word lines.

18. The method of claim 17, wherein:
the plurality of NAND strings include a plurality of drain select gates that are coupled to a plurality of bit lines and a plurality of source select gates that are coupled to a common source line;
the first group of word lines includes word lines closer to the source select gate than the second group of word lines; and
the one or more additional word lines are positioned between the first group of word lines and the second group of word lines.

19. The method of claim 18, wherein:
the first subset of word lines includes a last word line adjacent to the one or more additional word lines that is programmed with a first page of the user data when programming the first subset of word lines; and
the method further comprises programming the last word line of the first subset of word lines with a second page of the user data after erasing the second subset of word lines.

20. The method of claim 16, wherein:
after programming the second group of word lines, erasing a third group of the word lines while inhibiting the first group and the second group from being erased; and
programming the third group of word lines with a third portion of the user data after erasing the third group.

21. A method, comprising:
receiving a first programming request including user data associated with a block of non-volatile storage elements including a plurality of NAND strings;
determining a number of write/erase cycles associated with the block of non-volatile storage elements;
if the number of write/erase cycles is less than a threshold, responding to the first programming request by programming a first group of the word lines of the block with a first portion of the user data before erasing and programming a second group of the word lines of the block with a second portion of the user data; and
if the number of write/erase cycles is greater than the threshold, responding to the first programming request by programming a third group of the word lines of the block with a third portion of the user data before erasing and programming a fourth group of the word lines of the block with a fourth portion of the user data;
wherein the first group of word lines includes a larger number of word lines than the third group of word lines and the second group of word lines includes a smaller number of word lines than the fourth group of word lines.

22. The method of claim 21, wherein:
the first group of word lines includes the word lines of the third group and a portion of the word lines of the fourth group.

23. A non-volatile storage device, comprising:
a block of non-volatile storage elements including a plurality of NAND strings and a plurality of word lines in communication with the plurality of NAND strings; and
managing circuitry in communication with the block of non-volatile storage elements, the managing circuitry is configured to receive a programming request associated with the block of non-volatile storage elements and determine whether a number of write/erase cycles associated with the block is above a threshold;
the managing circuitry is configured to program a first group of the word lines before erasing and programming a second subset of the word lines to complete the programming request if the number of write/erase cycles is above the threshold; and
the managing circuitry is configured to program the plurality of word lines in a continuous program sequence to complete the programming request if the number of write/erase cycles is below the threshold.

* * * * *

UNITED STATES PATENT AND TRADEMARK OFFICE
CERTIFICATE OF CORRECTION

| | | |
|---|---|---|
| PATENT NO. | : 9,543,023 B2 | Page 1 of 1 |
| APPLICATION NO. | : 14/794236 | |
| DATED | : January 10, 2017 | |
| INVENTOR(S) | : Lai et al. | |

It is certified that error appears in the above-identified patent and that said Letters Patent is hereby corrected as shown below:

Column 26, Line 12 (Claim 10, Line 5): After "NAND" and before "are" delete "string" and replace with -- strings --.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*